(12) United States Patent
Hwang et al.

(10) Patent No.: US 7,482,703 B2
(45) Date of Patent: Jan. 27, 2009

(54) SEMICONDUCTOR DEVICE HAVING ALIGN MARK LAYER AND METHOD OF FABRICATING THE SAME

(75) Inventors: Ho-Ik Hwang, Seoul (KR); Soo-Cheol Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 183 days.

(21) Appl. No.: 11/473,852

(22) Filed: Jun. 23, 2006

(65) Prior Publication Data

US 2007/0117343 A1    May 24, 2007

(30) Foreign Application Priority Data

Nov. 22, 2005    (KR) .................. 10-2005-0111994

(51) Int. Cl.
 *H01L 23/544*    (2006.01)
(52) U.S. Cl. .................. 257/797; 257/E23.179; 438/401; 438/975
(58) Field of Classification Search .......... 438/401, 438/612–617, 975; 257/E23.179, 781, 797
 See application file for complete search history.

(56) References Cited

U.S. PATENT DOCUMENTS

| | | | | |
|---|---|---|---|---|
| 6,392,300 B1* | 5/2002 | Koike | .......... | 257/758 |
| 6,465,898 B1* | 10/2002 | Hnilo et al. | .......... | 257/797 |
| 6,958,546 B2* | 10/2005 | Fan et al. | .......... | 257/773 |
| 2005/0067722 A1* | 3/2005 | Koike | .......... | 257/797 |
| 2005/0158978 A1* | 7/2005 | Bohr | .......... | 438/612 |
| 2006/0019480 A1* | 1/2006 | Cheng et al. | .......... | 438/612 |
| 2006/0138673 A1* | 6/2006 | Kim | .......... | 257/779 |
| 2006/0227281 A1* | 10/2006 | Kang et al. | .......... | 349/158 |

FOREIGN PATENT DOCUMENTS

| | | |
|---|---|---|
| JP | 2004319549 | 11/2004 |
| JP | 2005044971 | 2/2005 |
| KR | 100258719 | 3/2000 |

OTHER PUBLICATIONS

English Abstract of Publication No. 100258719.
English Abstract of Publication No. 2004-319549.
English Abstract of Publication No. 2005-044971.

* cited by examiner

*Primary Examiner*—Ha Tran T Nguyen
*Assistant Examiner*—Daniel Whalen
(74) *Attorney, Agent, or Firm*—F. Chau & Associates, LLC

(57) ABSTRACT

A semiconductor device includes a pad electrode layer and an align mark layer, formed on the semiconductor substrate. A passivation layer is formed on the semiconductor substrate and exposes at least a portion of the top of the pad electrode layer and at least a portion of the top of the align mark layer. A light-transmitting protecting layer covers at least a portion of the passivation layer, exposes the top portion of the pad electrode layer exposed from the passivation layer, and covers the portion of the align mark layer exposed from the passivation layer.

22 Claims, 6 Drawing Sheets

SEMICONDUCTOR DEVICE HAVING ALIGN MARK LAYER AND METHOD OF FABRICATING THE SAME

CROSS-REFERENCE TO RELATED PATENT APPLICATION

This application claims the benefit of Korean Patent Application No. 10-2005-0111994, filed on Nov. 22, 2005, in the Korean Intellectual Property Office, the disclosure of which is hereby incorporated by reference herein in its entirety.

BACKGROUND OF THE INVENTION

1. Technical Field

The present invention relates to a semiconductor device and a method of fabricating the same, and more particularly, to a semiconductor device having an alignment mark used as an alignment key in a packaging operation for semiconductor chips and a method of fabricating the same.

2. Discussion of the Related Art

Semiconductor devices formed on a semiconductor substrate are typically assembled for connection to external devices and also packaged to protect these semiconductor devices from the external environment. In particular, a semiconductor device may have a pad electrode layer used as an input/output terminal for being connected to an external device, and an alignment mark used as an alignment key for assembling the semiconductor device. For example, a semiconductor device used as a driving device of a LCD (liquid crystal display) device may be assembled on a glass substrate. This is known as the COG (chip on glass) assembly method.

According to the COG assembly method, the semiconductor device is aligned on the glass substrate, using an align mark. For example, as for the COG assembly method, "Panel Structure for Chip on Glass" of Korean Patent No. 0258719 can be referred. However, a conventional alignment mark structure for a semiconductor device may cause alignment errors when the processes change during a fabricating operation.

FIG. 1 is a cross-sectional view illustrating a semiconductor device having a conventional alignment mark structure.

Referring to FIG. 1, an align mark layer 55 is formed on a semiconductor substrate 50 and enclosed by a passivation layer 60. A polyimide layer 70 to protect the semiconductor device is formed on the passivation layer 60. The polimide layer 70 is patterned so as to expose the passivation layer 60 formed on the align mark layer 55. Generally, the align mark layer 55 is formed in a field region (not shown) which is formed of an insulating layer for isolation.

An optical alignment apparatus perceives the contrast between the field region and a portion of the align mark layer 55 and aligns a semiconductor device by using this contrast between the field region and the align mark layer 55. However, a thickness (h) deviation of the passivation layer 60 formed on the align mark layer 55 may change the color of the portion of the align mark layer 55, and this color change may result in an alignment error for these semiconductor devices. As optical alignment apparatus processes the alignment of a semiconductor device based upon the contrast between the field region and the align mark layer 55 within a standard range, these alignment apparatuses may as a result not achieve proper alignment for a semiconductor device having a contrast outside of the standard range.

The contrast of the passiviation layer 60 changes significantly according to the thickness (h) deviation of the passiviation layer 60. Thus, it may be difficult to control the contrast by controlling the thickness (h) of the passivation layer 60. Accordingly, even though the passivation layer 60 may be within an allowable process margin range, an alignment error with respect to the semiconductor device may still occur.

Thus, there is a need for a semiconductor device having reduced alignment error. In addition, there is also a need for a method of fabricating a semiconductor device that reduces alignment error during the assembly of the semiconductor device and that is cost-effective.

SUMMARY OF THE INVENTION

Exemplary embodiments of the present invention provide a semiconductor device having reduced alignment error.

In addition, exemplary embodiments of the present invention also provide a method of fabricating a semiconductor device that reduces alignment error during assembly of the semiconductor device and that is also cost-effective.

According to an exemplary embodiment of the present invention, a semiconductor device is provided. The semiconductor device includes a pad electrode layer on a semiconductor substrate, an align mark layer formed on the semiconductor substrate, and a passivation layer formed on the semiconductor substrate, thereby exposing at least the top portion of the pad electrode layer and at least the top portion of the align mark layer. The semiconductor device further includes a light-transmitting protecting layer covering at least a portion of the passivation layer, exposing the portion of the top of the pad electrode layer exposed from the passivation layer, and covering the portion of the top of the align mark layer exposed from the passivation layer.

The pad electrode layer and the align mark layer may be formed of the same materials. For example, the pad electrode layer may comprise a barrier metal layer, an interconnection metal layer on the barrier metal layer, and a capping metal layer on the interconnection metal layer. The capping metal layer may expose at least a portion of the interconnection metal layer. Further, the align mark layer may include a barrier metal layer, an interconnection metal layer on the barrier metal layer, and a capping metal layer on the interconnection metal layer, and the capping metal layer may expose at least a portion of the interconnection metal layer.

The semiconductor device may further include a bump on the interconnection metal layer of the pad electrode layer exposed from the passivation layer and the light-transmitting protecting layer. The semiconductor device may further include a second barrier metal layer disposed between the interconnection metal layer of the pad electrode layer and the bump, and between the bump and the passivation layer.

According to an exemplary embodiment of the present invention, a semiconductor device is provided. The semiconductor device includes an interlayer insulating layer on a semiconductor substrate, a pad electrode layer used as an input/output terminal and formed on the interlayer insulating layer, an align mark layer used as an alignment key of an assembling operation and formed on the interlayer insulating layer, a passivation layer exposing at least a portion of the top of the pad electrode layer and at least a portion of the top of the align mark layer and formed on the interlayer insulating layer, and a polyimide layer covering at least a portion of the passivation layer, exposing the top portion of the pad electrode layer exposed from the passivation layer, and covering the portion of the top of the align mark layer exposed from the passivation layer. The semiconductor device further includes a bump formed on the pad electrode layer exposed from the passivation layer and the polyimide layer.

According to an exemplary embodiment of the present invention, a method of fabricating a semiconductor device is provided. The method includes forming a pad electrode layer and an align mark layer on a semiconductor substrate, forming a passivation layer on the semiconductor substrate, thereby exposing at least a portion of the top of the pad electrode layer and at least a portion of the top of the align mark layer, and forming a light-transmitting protecting layer on the resultant structure on which the passivation layer is formed, thereby exposing the top portion of the pad electrode layer exposed from the passivation layer and covering the top portion of the align mark layer exposed from the passivation layer.

The method of fabricating the semiconductor device according to exemplary embodiments of the present invention may further include forming a bump on the pad electrode layer exposed from the passivation layer and the light-transmitting protecting layer. The bump may be formed by a plating process.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EXEMPLARY EMBODIMENTS OF THE INVENTION

The present invention will now be described more fully hereinafter with reference to the accompanying drawings, in which preferred embodiments of the invention are shown. This invention may, however, be embodied in many different forms and should not be construed as being limited to the embodiments set forth herein.

Structure

Figure 2:
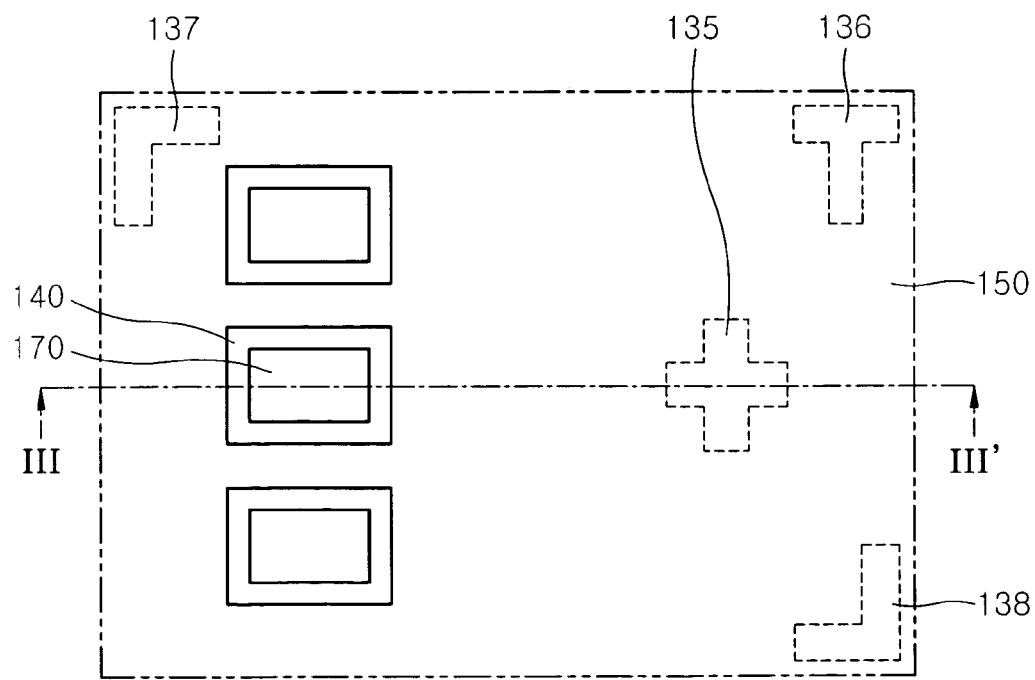
FIG. 2 is a plan view illustrating a semiconductor device according to an exemplary embodiment of the present invention.
Figure 3:
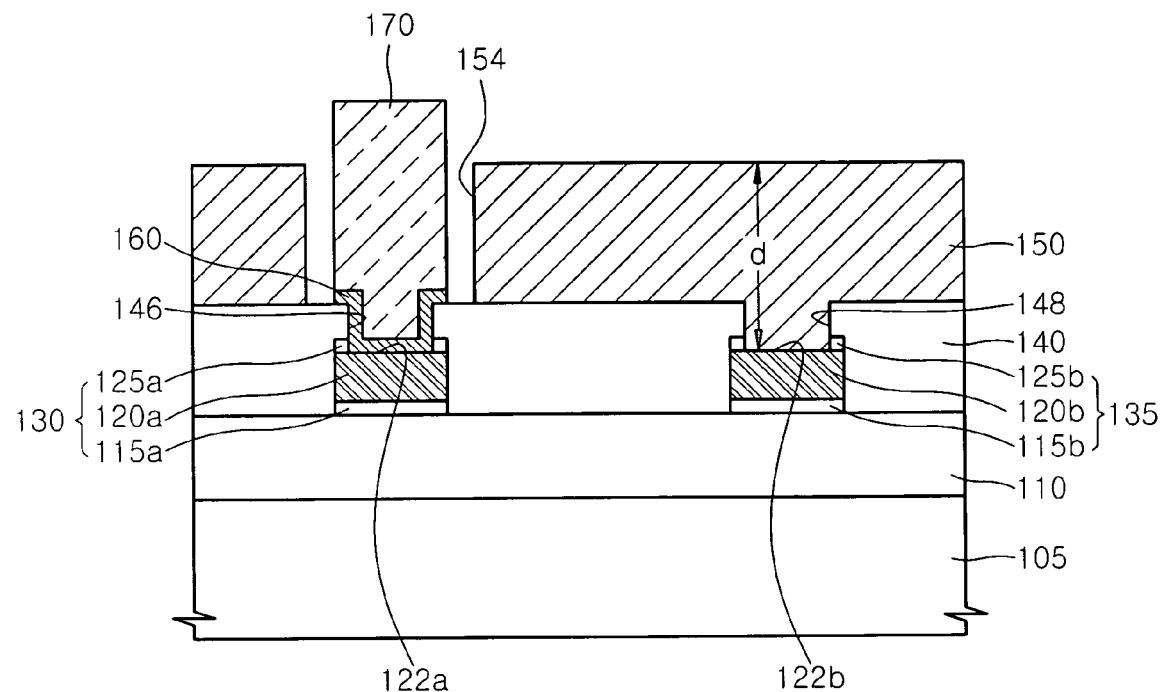
FIG. 3 is a cross-sectional view of the semiconductor device, as taken along the line III-III' of FIG. 2.

FIG. 2 is a plan view illustrating a semiconductor device according to an exemplary embodiment of the present invention, and FIG. 3 is a cross-sectional view of the semiconductor device as taken along the line III-III' of FIG. 2. The semiconductor device according to the present exemplary embodiment of the invention may include the driving device of a LCD (liquid crystal display) device but is not limited to the driving device. For example, the semiconductor device may include a semiconductor device for a COG (chip on glass) assembly.

Referring to FIG. 2, the semiconductor device comprises at least one or more align mark layers 135, 136, 137 and 138 and at least one or more bumps 170. The align mark layers 135, 136, 137 and 138 are covered with a light-transmitting protecting layer 150. The bumps 170 assist in connecting the semiconductor device to external devices. For example, the bumps 170 may be solder bumps. The align mark layers 135, 136, 137 and 138 are formed in a field region which is formed of an insulating layer for isolation.

The number of the align mark layers 135, 136, 137 and 138 and the number of the bumps 170 in FIG. 2 are exemplary. Thus, a skilled person in this art may appropriately select the number of the align mark layers and the number of the bumps. The align mark layers 135, 136, 137 and 138 have a flat panel structure in a "+" shape, a "T" shape, an "L" shape, or a "Γ" shape. However, the shapes of the align mark layers are exemplary, and thus the align mark layers may have various shapes to be perceived in an optical alignment apparatus. The align mark layer 135 according to the present exemplary embodiment is described below.

Referring to FIG. 3, the bump 170 is electrically connected to a pad electrode layer 130 positioned under the bump 170. The pad electrode layer 130 and the align mark layer 135 are formed on an interlayer insulating layer 110 on a semiconductor substrate 105. The pad electrode layer 130 is electrically connected to unit devices in or on the semiconductor substrate 105, and the pad electrode layer 130 functions as an input/output terminal with respect to the unit devices. For example, the unit devices may include a transistor or capacitor structure.

The semiconductor device is formed on the semiconductor substrate 105 and further comprises a plurality of interconnection electrode layers connected to the unit devices. For example, the interlayer insulating layer 110 may have a structure in which a plurality of insulating layers are stacked. In addition, the plurality of interconnection electrode layers may be formed on the plurality of the insulating layers, respectively. In this case, the pad electrode layer 130 is electrically connected to one or more interconnection electrode layers. For example, the interlayer insulating layer 110 comprises a silicon oxide layer or a silicon nitride layer.

The pad electrode layer 130 and the align mark layer 135 may be formed of the same materials. For example, the pad electrode layer 130 may comprise a barrier metal layer 115a, an interconnection metal layer 120a and a capping metal layer 125a, and the align mark layer 135 may comprise a barrier metal layer 115b, an interconnection metal layer 120b and a capping metal layer 125b. The barrier metal layers 115a and 115b may be formed of the same materials on the interlayer insulating layer 110. In addition, the interconnection metal layers 120a and 120b may be formed of the same materials on the barrier metal layers 115a and 115b, respectively. Moreover, the capping metal layers 125a and 125b may be formed of the same materials on the interconnection metal layers 120a and 120b, respectively.

For example, the barrier metal layers 115a and 115b may comprise a titanium layer, a tantalum layer, a titanium nitride layer, a tantalum nitride layer, or a composition layer of two or more of these layers being stacked. The interconnection metal layers 120a and 120b may comprise, for example, an aluminum layer or a copper layer having low electric resistance. The capping metal layers 125a and 125b may comprise, for example, a titanium layer, a tantalum layer, a titanium nitride layer, a tantalum nitride layer, or a composition layer of two or more of these layers being stacked. The capping metal layers 125a and 125b may be used as an anti-reflection layer when the interconnection metal layers 120a and 120b are patterned, respectively.

The capping metal layers 125a and 125b may be patterned to expose at least a portion 122a of the interconnection metal layers 120a and at least a portion 122b of the interconnection metal layers 120b, respectively. However, according to an exemplary embodiment of the present invention, the capping metal layers 125a and 125b may cover the tops of the interconnection metal layers 120a and 120b, respectively. According to an exemplary embodiment of the present invention, the pad electrode layer 130 and the align mark layer 135 may further comprise a plurality of metal layers or may be formed of one metal layer, respectively.

A passivation layer 140 is formed on the interlayer insulating layer 110 and exposes at least a portion 122a of the top of the pad electrode layer 130 and at least a portion 122b of the top of the align mark layer 135. For example, the passivation layer 140 comprises holes 146 and 148. The portion 122a of the pad electrode layer 130 is exposed by the hole 146, and the portion 122b of the align mark layer 135 is exposed by the other hole 148.

The holes 146 and 148 are extended inside the capping metal layers 125a and 125b, and the interconnection metal layers 120a and 120b are exposed from the passivation layer 140 and the capping metal layers 125a and 125b by the holes 146 and 148, respectively. The sidewalls of the pad electrode layer 130 and the sidewalls of the align mark layer 135 are enclosed by the passivation layer 140. For example, the passivation layer 140 may comprise a silicon nitride layer or a silicon oxide layer. The passivation layer 140 protects the unit devices in or on the semiconductor substrate 105 from water.

A light-transmitting protecting layer 150 is formed to cover at least a portion of the passivation layer 140. In this exemplary embodiment, the light-transmitting protecting layer 150 covers the portion 122b of the top of the align mark layer 135 and expose the portion 122a of the top of the pad electrode layer 130. For example, the light-transmitting protecting layer 150 comprises a hole 154, and the portion 122b of the top of the align mark layer 135 and portions of the passivation layer 140 around the portion 122b are exposed by the hole 154.

The light-transmitting protecting layer 150 protects the structure of the semiconductor device from external conditions, e.g., physical impact or chemical permeation such as water. For example, the light-transmitting protecting layer 150 may further comprise a photosensitive or non-photosensitive polyimide layer or silicon rubber, epoxy or urethane insulating layers.

While the thickness changes of the passivation layer 140 may vary the color of the portion of the align mark layer 135, the thickness (d) changes to the light-transmitting protecting layer 150 cause nearly no varying of the color of the portion of the align mark layer 135 when viewed from above. Thus, even though the thickness (d) of the light transmitting layer 150 may be changed by process variation during the formation of the light-transmitting protecting layer 150, the color of the portion of the align mark layer 135 is still consistently maintained. In other words, the contrast between the field region and the portion of the align mark layer 135 is consistently maintained. Consequently, an optical alignment apparatus may align the semiconductor device, without errors, even though the thickness (d) of the light-transmitting protecting layer 150 may be slightly different.

For example, when the portion 122b of the top of the interconnection metal layer 120b is exposed from the capping metal layer 125b, the contrast between the field region and the portion of the align mark layer 135 is substantially maintained. However, according to an exemplary embodiment of the present invention, the capping metal layer 125b covers the portion 122b of the interconnection metal layer 120b, and the contrast between the field region and the portion of the align mark layer 135 is maintained to some extent.

The bump 170 is formed on the portion 122a of the top of the pad electrode layer 130 exposed from the passivation layer 140 and the light-transmitting protecting layer 150. For example, the bump 170 fills in the hole 146 of the passivation layer 140, extends onto the passivation layer 140 at a predetermined width, and extends onto the light-transmitting protecting layer 150. The bump 170 comes into direct contact with the portion 122a of the top of the interconnection metal layer 120a. However, according to another exemplary embodiment of the present invention, the bump 170 may come into direct contact with the capping metal layer 125a.

For example, the portion of the bump 170 exposed above the light-transmitting protecting layer 150 is used as a contact portion with a glass substrate in an assembling operation of the COG assembly. The bump 170 comprises, for example, a gold (Au) layer. A second barrier metal layer 160 is formed between the bump 170 and the portion 122a of the top of the interconnection metal layer 120a and between the bump 170 and the passivation layer 140. For example, the second barrier metal layer 160 comprises an alloy layer of copper (Cu) and nickel (Ni) and prevents the mutual diffusion of the second barrier metal layer 160 and the interconnection metal layer 120a.

However, according to an exemplary embodiment of the present invention, when the semiconductor device is not assembled by the COG assembly method, the bump 170 may be not used. For example, the pad electrode layer 130 may be connected to external devices by using another conductive connecting layer (s), e.g., conductive wire.

Manufacturing Method

A method of manufacturing a semiconductor device according to an exemplary embodiment of the present invention will be described in reference to FIGS. 4 through 11.

Figure 4:
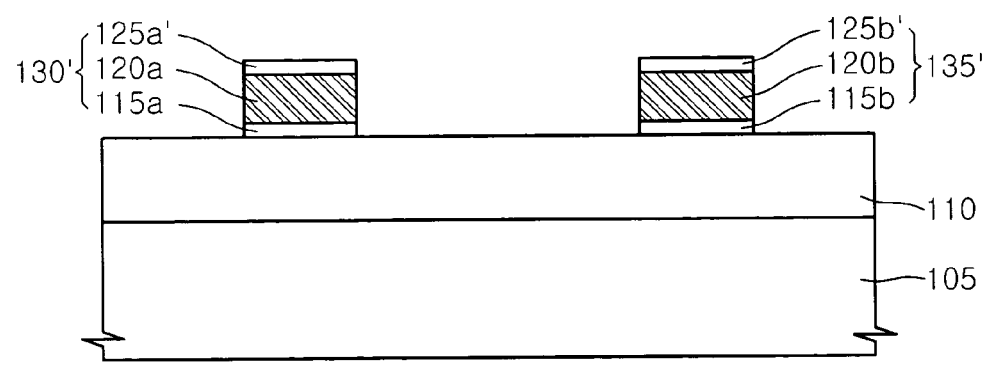
FIGS. 4 through 11 are cross-sectional views illustrating a method of fabricating a semiconductor device according to an exemplary embodiment of the present invention.

Referring to FIG. 4, an interlayer insulating layer 110 is formed on a semiconductor substrate 105, and a preliminary pad electrode layer 130' and a preliminary align mark layer 135' are formed on the interlayer insulating layer 110. The preliminary pad electrode layer 130' and the preliminary align mark layer 135' comprise barrier metal layers 115a and 115b, interconnection metal layers 120a and 120b, and preliminary capping metal layers 125a' and 125b'.

For example, a barrier metal layer, an interconnection metal layer and a capping metal layer are sequentially formed on the interlayer insulating layer 110. Then, the preliminary pad electrode layer 130' and the preliminary align mark layer 135' are formed by patterning the barrier metal layer, the interconnection metal layer and the capping metal layer using conventional photolithography and etching techniques.

Figure 5:
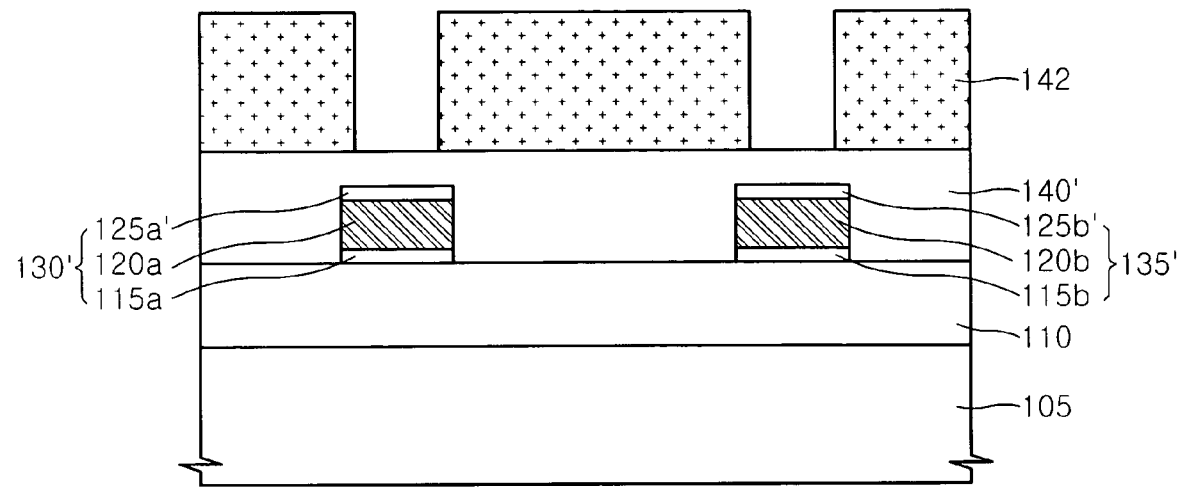

Referring to FIG. 5, a passivation layer 140' is formed to cover the preliminary pad electrode layer 130' and the preliminary align mark layer 135'. For example, the passivation layer 140' comprising a silicon oxide layer or a silicon nitride layer is formed by using a CVD (chemical vapor deposition) method.

Then, a first photoresist layer 142 exposing the passivation layer 140' on portions of the preliminary pad electrode layer 130' and the preliminary align mark layer 135 is formed on the passivation layer 140'.

Figure 6:
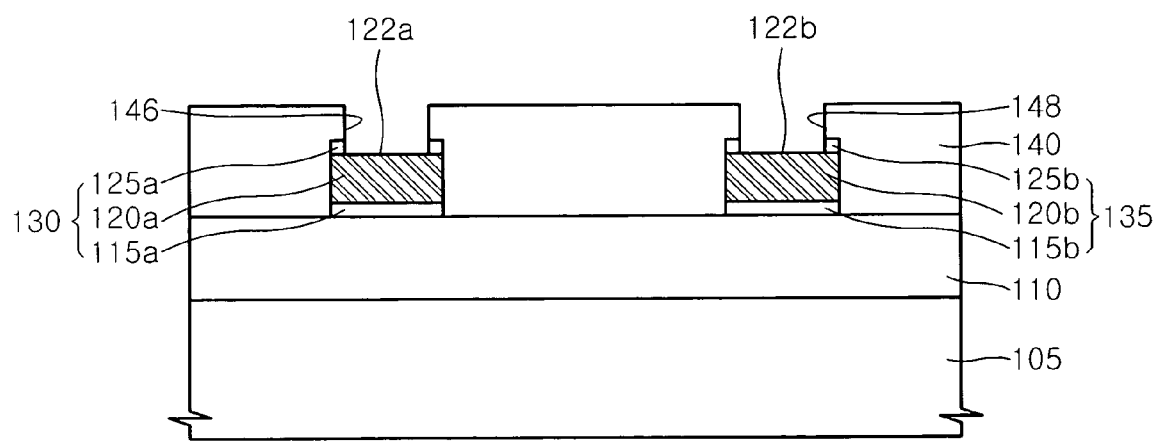

Referring to FIG. 6, a passivation layer 140 comprising holes 146 and 148 is formed by etching the exposed portions of the passivation layer 140' and the capping metal layers 125a and 125b using the first photoresist layer 142 (of FIG. 5) as an etch mask. The capping metal layers 125a and 125b expose portions 122a and 122b of the tops of the interconnection metal layers 120a and 120b by the holes 146 and 148, respectively. Thus, a pad electrode layer 130 and an align mark layer 135 each comprise the barrier metal layers 115a and 115b, the interconnection metal layers 120a and 120b, and the capping metal layers 125a and 125b, respectively. The align mark layer 135 may have, for example, a flat panel structure in a "+" shape, a "T" shape, an "L" shape, or a "Γ" shape.

However, according to an exemplary embodiment of the present invention, the preliminary capping metal layers 125a' and 125b' (of FIG. 5) may cover the tops of the interconnection metal layers 120a and 120b by not being etched. In this case, the interconnection metal layer 130 and the preliminary interconnection metal layer 130' (of FIG. 5) are the same as each other, and the align mark layer 135 and the preliminary align mark layer 135' (of FIG. 5) are the same as each other.

Figure 7:
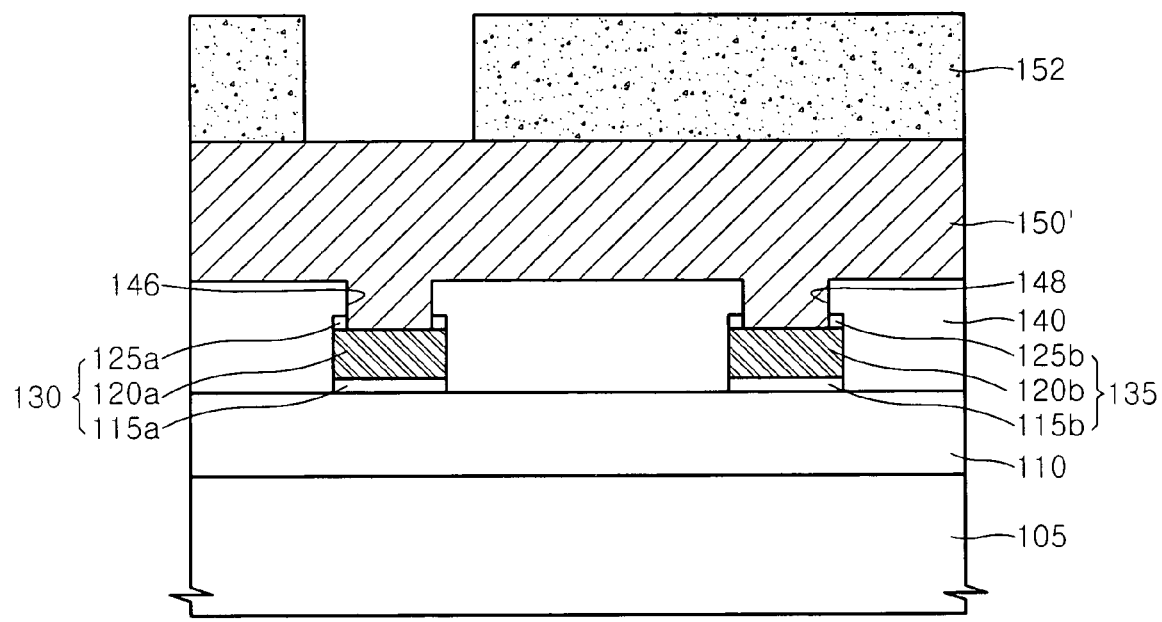

Referring to FIG. 7, a light-transmitting protecting layer 150' is formed on a resultant structure on which the passivation layer 140 is formed. The light-transmitting protecting layer 150' fills in the holes 146 and 148 of the passivation layer 140. For example, the light-transmitting protecting layer 150' comprises a photosensitive or non-photosensitive polyimide layer or a silicon rubber, epoxy or urethane insulating layer.

Then, a second photoresist layer 152 exposing a portion of the light-transmitting protecting layer 150' on at least a portion 122a of the top of the interconnection metal layer 120a is formed on the light-transmitting protecting layer 150'.

Figure 8:
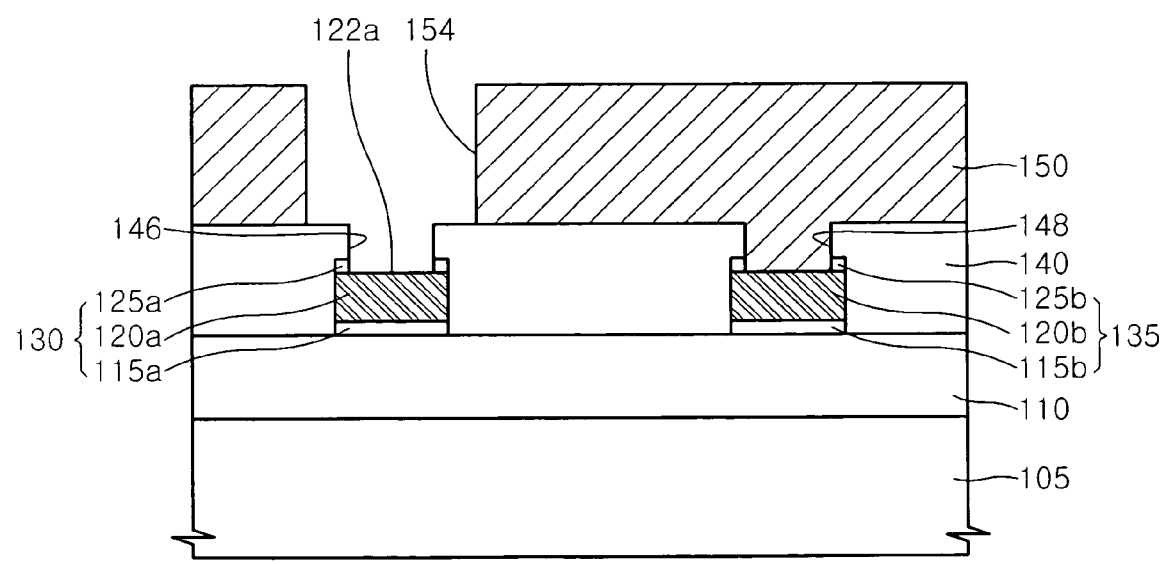

Referring to FIG. 8, a light-transmitting protecting layer 150 is formed by etching the exposed portion of the light-transmitting protecting layer 150' (of FIG. 7) using the second photoresist layer 152 (of FIG. 7) as the etch mask. The light-transmitting protecting layer 150 fills in the hole 148 of the passivation layer 140 and exposes the other hole 146. That is, the light-transmitting protecting layer 150 covers the portion 122b of the top of the interconnection metal layer 120b on the align mark layer 135 and exposes the portion 122a of the top of the interconnection metal layer 120a. The light-transmitting protecting layer 150 comprises a hole 154, and the hole 154 has a greater width than the hole 146 of the passivation layer 140. Thus, the light-transmitting protecting layer 150 exposes the portion of the passivation layer 140 around the pad electrode layer 130.

Figure 9:
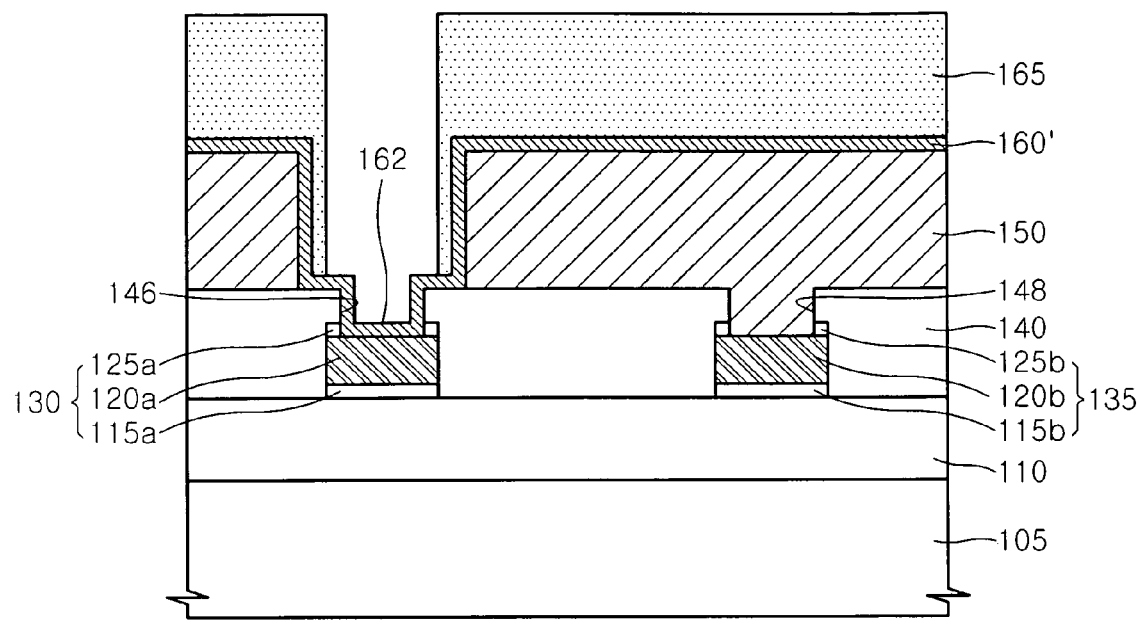

Referring to FIG. 9, a second barrier metal layer 160' is formed on a resultant structure on which the light-transmitting protecting layer 150 is formed. For example, the second barrier metal layer 160' comprises an alloy layer of nickel and copper and is formed by a conventional deposition method.

Then, a third photoresist layer 165 exposing the portion 122a of the top of the interconnection metal layer 120a is formed on the second barrier metal layer 160'. For example, the photoresist layer 165 covers a portion of the passivation layer 140 exposed by the hole 154 of the light-transmitting protecting layer 150 and exposes the hole 146 of the passivation layer 140. Thus, a portion 162 of the second barrier metal layer 160' is exposed on the portion 122a of the top of the interconnection metal layer 120a.

Figure 10:
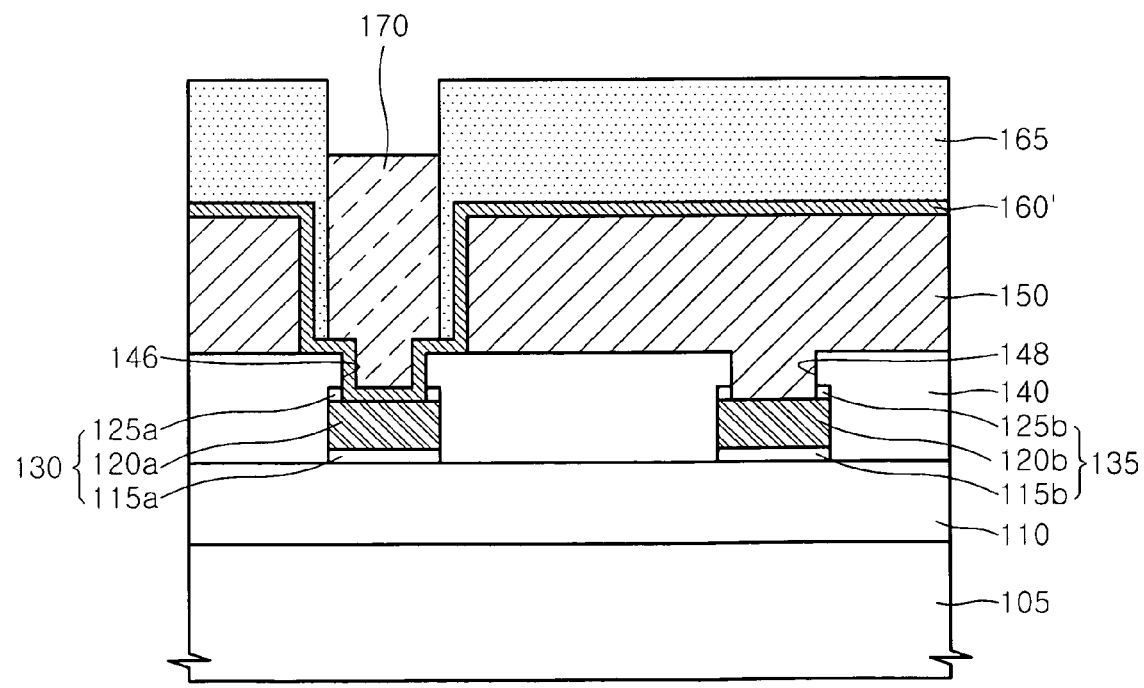

Referring to FIG. 10, a bump 170 is formed on the second barrier metal layer 160' exposed by the third photoresist layer 165. Then, the third photoresist layer 165 is removed. For example, the bump 170 may comprise a gold (Au) layer and be formed by plating. However, according to another exemplary embodiment of the present invention, the second barrier metal layer 160' may not be used, and the bump 170 may be formed on the pad electrode layer 130.

Figure 11:
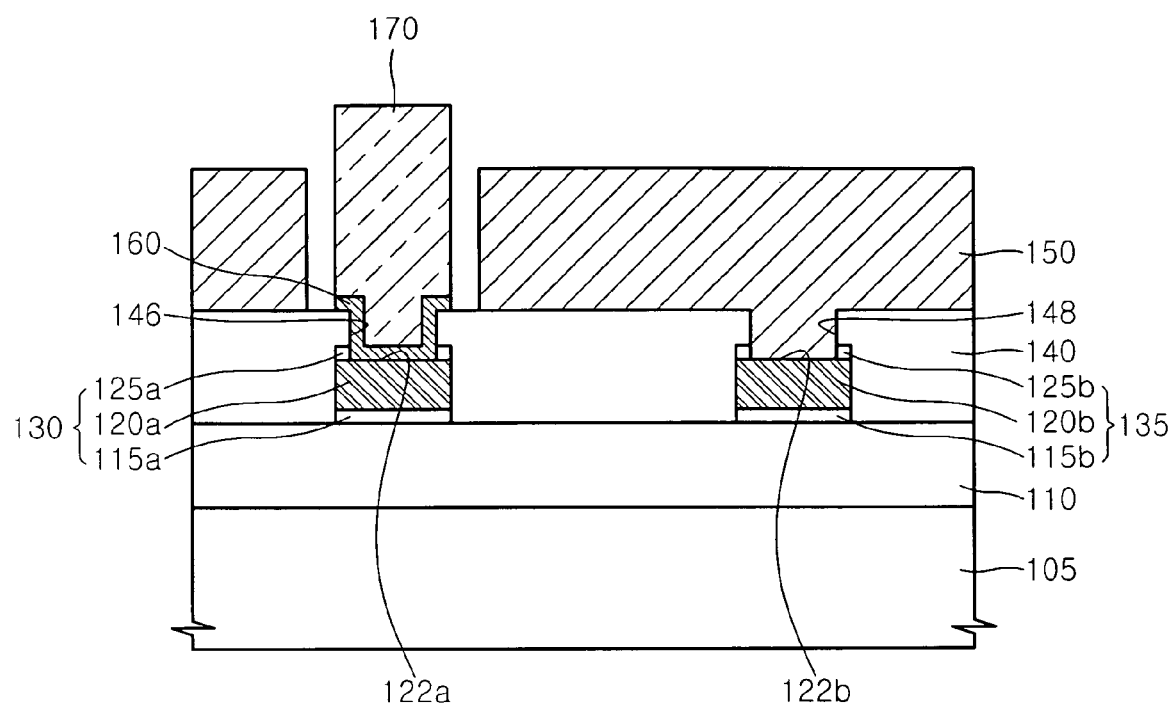

Referring to FIG. 11, a second barrier metal layer 160 is formed by removing the portion of the second barrier metal layer 160' (of FIG. 10) exposed from the bump 170. Thus, the second barrier metal layer 160 is inserted between the bump 170 and the portion 122a of the top of the interconnection metal layer 120a and between the bump 170 and the passivation layer 140.

During a removal operation of the portion of the second barrier metal layer 160', the light-transmitting protecting layer 150 functions as the etch mask to protect the align mark layer 135. If the light-transmitting protecting layer 150 does not cover the align mark layer 135, the removal operation may either need to be accomplished through more complicated processes, and/or a portion of the align mark layer 135 may become damaged. Thus, exemplary embodiments of the present invention simplify the operation of removing a portion of the second barrier metal layer 160' and prevent a portion of the align mark layer from being damaged.

Experiment

Table 1 compares the alignment characteristics of the semiconductor device according to an exemplary embodiment of the present invention with those of the semiconductor device having the conventional alignment mark structure.

TABLE 1

|  | Sample | Grey Scale (Align mark layer) | Grey Scale (Field Region) | Δ Grey Scale |
|---|---|---|---|---|
| Group I | #1 | 117 | 64 | 53 |
|  | #2 | 119 | 64 | 55 |
| Group II | #1 | 114 | 60 | 54 |
|  | #2 | 110 | 57 | 53 |
| Group III | #1 | 107 | 142 | −35 |
|  | #2 | 113 | 142 | −29 |

Figure 1:
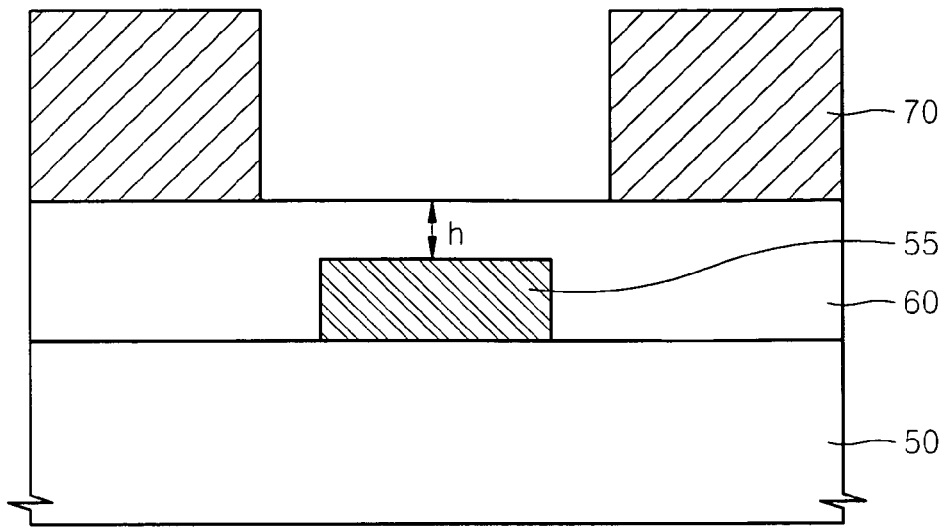
FIG. 1 is a cross-sectional view illustrating a semiconductor device having a conventional align mark structure.

Group I and Group II represent a semiconductor device according to an exemplary embodiment of the present invention, wherein as an example of the light-transmitting protecting layer 150, the polyimide layer is formed on the align mark layer 135 of the semiconductor device, as shown in FIG. 3. Group III represents a conventional semiconductor device, wherein the passivation layer 60 is formed on the align mark layer 55, as shown in FIG. 1. The thickness for the polyimide layer of Group I differs from the thickness of the polyimide layer of Group II. Group I has a polyimide layer having the thickness of about 3 μm, whereas Group II has a polyimide layer having the thickness of about 3.8 μm.

As shown from the results illustrated in Table 1, in Group III representing the conventional semiconductor device, the difference value of the grey scale indicating the contrast between the align mark layer 135 and the field region is −29 to −35 (arbitrary scale). Thus, the difference value of the grey scale in Group III is within a relatively low and broad range. Additionally, the results depicted in Table 1 also show that, in Group I and Group II representing a semiconductor device according to an exemplary embodiment of the present invention, the difference value of the grey scale is about 53 to about 55 (arbitrary scale). Therefore, the difference value of the grey scale in Group I and Group II is higher and more uniform than that in Group III.

As discussed above, Table 1, shows that the semiconductor device according to exemplary embodiments of the present invention has a greater difference value of the grey scale in comparison to conventional semiconductor devices. Consequently, the alignment sensitivity in an optical alignment apparatus may be enhanced by using semiconductor devices and/or methods in accordance with exemplary embodiments of the present invention. In addition, as illustrated from the results of Table 1, the range for the difference of the grey scale for the semiconductor according to an exemplary embodiment of the present invention is a substantially narrow one, and therefore the contrast through the thickness of the polyimide layer of the semiconductor device is not changed. Thus, even though the thickness of the polyimide layer may be subjected to process variation, semiconductor devices according to exemplary embodiments may still be aligned without errors.

With the semiconductor device according to exemplary embodiments of the present invention, the color of the portion of the align mark layer is consistently maintained even though the thickness of the light-transmitting protecting layer is changed by process variation during the operation of forming the light-transmitting protecting layer. Thus, an optical alignment apparatus may align the semiconductor device of exemplary embodiments of the present invention without errors even though the thickness of the light-transmitting protecting layer may be slightly different. For example, the semiconductor device and the glass substrate can be aligned without errors by using the align mark layer in the assembling operation by the COG assembly method.

Also, with methods for fabricating a semiconductor device in accordance with exemplary embodiments of the present invention, the light-transmitting protecting layer functions as the etch mask to protect the align mark layer during the operation of removing a portion of the second barrier metal layer. Thus, the operation of removing a portion of the second barrier metal layer is simplified, and a portion of the align mark layer is prevented from being damaged.

While the present invention has been particularly shown and described with reference to exemplary embodiments thereof, it will be understood by those of ordinary skill in the art that various modifications may be made without departing from the spirit and scope of the present invention as defined by the following claims.

What is claimed is:

1. A semiconductor device comprising:
    a pad electrode layer on a first region of a semiconductor substrate;
    an align mark layer formed on a second region of the semiconductor substrate;
    a passivation layer formed on the pad electrode layer and the align mark layer, thereby exposing at least a portion of the top of the pad electrode layer and at least a portion of the top of the align mark layer; and
    a light-transmitting protecting layer covering at least a portion of the passivation layer, exposing the top portion of the pad electrode layer exposed from the passivation layer, and formed directly on the portion of the top portion of the align mark layer exposed from the passivation layer.

2. The semiconductor device of claim 1, wherein the pad electrode layer and the align mark layer are formed of the same material.

3. The semiconductor device of claim 2, wherein the pad electrode layer comprises a barrier metal layer, an interconnection metal layer on the barrier metal layer, and a capping metal layer on the interconnection metal layer, and the capping metal layer exposes at least a portion of the interconnection metal layer.

4. The semiconductor device of claim 2, wherein the align mark layer comprises a barrier metal layer, an interconnection metal layer on the barrier metal layer, and a capping metal layer on the interconnection metal layer, and the capping metal layer exposes at least a portion of the interconnection metal layer.

5. The semiconductor device of claim 3, wherein the passivation layer exposes the portion of the interconnection metal layer exposed from the capping metal layer of the pad electrode layer.

6. The semiconductor device of claim 5, further comprising a bump on the interconnection metal layer of the pad electrode layer exposed from the passivation layer and the light-transmitting protecting layer.

7. The semiconductor device of claim 6, further comprising a second barrier metal layer disposed between the interconnection metal layer of the pad electrode layer and the bump and between the bump and the passivation layer.

8. The semiconductor device of claim 1, wherein the light-transmitting protecting layer comprises a polyimide layer.

9. The semiconductor device of claim 1, wherein the align mark layer has a flat panel structure having a shape comprising one of a "+" shape, a "T" shape, an "L" shape, or a "T" shape.

10. A semiconductor device comprising:
    an interlayer insulating layer on a semiconductor substrate;
    a pad electrode layer formed on the interlayer insulating layer located on a first region of the semiconductor substrate;
    an align mark layer used as an alignment key of an assembling operation and formed on the interlayer insulating layer located on a second region of the semiconductor substrate;
    a passivation layer formed on the pad electrode layer and the align mark layer, thereby exposing at least a portion of the top of the pad electrode layer and at least a portion of the top of the align mark layer, and formed on the interlayer insulating layer;
    a polyimide layer covering at least a portion of the passivation layer, exposing the top portion of the pad electrode layer exposed from the passivation layer, and formed directly on the portion of the align mark layer exposed from the passivation layer; and
    a bump on the pad electrode layer exposed from the passivation layer and the polyimide layer.

11. The semiconductor device of claim 10, further comprising a second barrier metal layer disposed between the pad electrode layer and the bump and between the bump and the passivation layer.

12. The semiconductor device of claim 10, wherein the pad electrode layer and the align mark layer are formed of the same material.

13. The semiconductor device of claim 12, wherein the pad electrode layer and the align mark layer each comprise barrier metal layers, interconnection metal layers on the barrier metal layers, and capping metal layers on the interconnection metal layers, respectively, and the respective capping metal layers of the pad electrode layer and the align mark layer expose at least a portion of the interconnection metal layer.

14. The semiconductor device of claim 10, wherein the align mark layer has a flat panel structure having a shape comprising one of a "+" shape, a "T" shape, an "L" shape, or a "T" shape.

15. A method of fabricating a semiconductor device, the method comprising:
    forming a pad electrode layer on a first region of a semiconductor substrate;
    forming an align mark layer on a second region of the semiconductor substrate;
    forming a passivation layer on the pad electrode layer and the align mark layer, thereby exposing at least a portion of the top of the pad electrode layer and at least a portion of the top of the align mark layer; and
    forming a light-transmitting protecting layer on the resultant structure on which the passivation layer is formed, thereby exposing the top portion of the pad electrode layer exposed from the passivation layer and formed directly on the portion of the align mark layer exposed from the passivation layer.

16. The method of claim 15, wherein the forming of the pad electrode layer and the align mark layer comprises:

forming a barrier metal layer on the semiconductor substrate;

forming an interconnection metal layer on the barrier metal layer;

forming a capping metal layer on the interconnection metal layer;

forming the pad electrode layer comprising a barrier metal layer, an interconnection metal layer and a capping metal layer by patterning the barrier metal layer, the interconnection metal layer and the capping metal layer of the pad electrode layer; and forming the align mark layer comprising a barrier metal layer, an interconnection metal layer and a capping metal layer by patterning the barrier metal layer, the interconnection metal layer and the capping metal layer of the align mark layer.

17. The method of claim 16, further comprising exposing the interconnection metal layer by removing a predetermined portion of the capping metal layers of the pad electrode layer and the align mark layer, before forming the light-transmitting protecting layer.

18. The method of claim 15, further comprising forming a bump on the pad electrode layer exposed from the passivation layer and the light-transmitting protecting layer.

19. The method of claim 15, further comprising:

forming a preliminary second barrier metal layer on a resultant structure on which the light-transmitting protecting layer is formed;

forming a mask layer on the preliminary second barrier metal layer exposing the portion of the preliminary second barrier metal layer on the pad electrode layer exposed from at least the light-transmitting protecting layer;

forming a bump on the portion of the preliminary second barrier metal layer exposed from the mask layer;

removing the mask layer; and forming .a second barrier metal layer by etching the portion of the preliminary second barrier metal layer exposed from the bump.

20. The method of claim 19, wherein a plating process is used in the forming of the bump.

21. The method of claim 15, wherein the light-transmitting protecting layer comprises a polyimide layer.

22. The method of claim 15, wherein the align mark layer has a flat panel structure having a shape comprising one of a "+" shape, a "T" shape, an "L" shape, or a "I" shape.

* * * * *